United States Patent [19]

Pritchard

[11] Patent Number: 5,133,014

[45] Date of Patent: Jul. 21, 1992

[54] SEMICONDUCTOR EMULATION OF TUBE AMPLIFIERS

[76] Inventor: Eric K. Pritchard, Rte. 1, Box 536, Berkeley Springs, W. Va. 25411

[21] Appl. No.: 466,865

[22] Filed: Jan. 18, 1990

[51] Int. Cl.$^5$ .............................................. H03G 3/00
[52] U.S. Cl. .............................. 381/61; 307/490; 307/268; 328/16; 84/692; 84/701; 84/735; 84/737
[58] Field of Search .................. 328/14, 16, 20, 23, 328/32; 307/490, 268; 381/61; 84/692, 701, 735, 737

[56] References Cited

U.S. PATENT DOCUMENTS

| | | | |
|---|---|---|---|
| 3,551,694 | 12/1970 | Boxall | 307/490 |
| 4,034,304 | 7/1977 | Hallock | 307/490 |
| 4,532,604 | 7/1985 | Baker | 328/16 |
| 4,995,084 | 2/1991 | Pritchard | 381/61 |
| 5,032,796 | 7/1991 | Tiers et al. | 381/61 |

*Primary Examiner*—Forester W. Isen
*Attorney, Agent, or Firm*—Barnes & Thornburg

[57] ABSTRACT

A distortion synthesizer, having a first distortion circuit, a tone control circuit for altering the tonality of the first distorted signal and a second distortion circuit for introducing harmonics into said tone controlled signal. At least one of the distortion circuits introduces harmonics without clipping. The second distortion circuit also for clips the resultant signal as a function of said resultant signal. The first distortion circuit limits and introduces even harmonics, preferrably predominantly second harmonics. The second distortion circuit introduces odd harmonics, preferably by predominantly third harmonics, prior to clipping, and also compress the signal. The distortion circuits include a variable gain stage which increases with increased input using a plurality of switches which progressively add parallel resistors to progressively increase output current. A circuit simulating transformer saturation is also provided in the second distortion circuit.

37 Claims, 4 Drawing Sheets

SEMICONDUCTOR EMULATION OF TUBE AMPLIFIERS

BACKGROUND AND SUMMARY OF THE INVENTION

The present invention relates generally to amplifiers and more specifically to all forms of audio amplifiers and guitar amplifiers. It further relates to a distortion synthesizer which replicates the sounds produced by overdriven vacuum tube amplifiers.

Since semiconductor devices have become viable components for amplifiers, there has been a debate upon the virtues of semiconductor or solid state amplifiers versus the vacuum tube amplifiers. Some believe that tube amplifiers work better because vacuum tubes are more natural amplifiers than semiconductor devices. Some think that semiconductor amplifiers produce a sound that has no warmth; they are too clear until the semiconductor devices saturate, then they are too noisy. Tube amplifiers seem not to give up when over-driven, they seem to try to reach the impossible.

The vacuum tube amplifiers, however, do have some limitations. For some people, the limitation is simply the warmup time and the fragility of vacuum tubes. For guitarists the problems are more serious. A powerful amplifier does not sound right when operating at low levels such as those needed to fill a small room.

The prior art is filled with various attempts to satisfy the guitarists need for the tube amplifier sound with the more reliable semiconductor devices or just to enhance the sound from vacuum tube amplifiers. Moog, in U.S. Pat. No. 4,180,707, simulates the over-driven amplifier with a compressor and a clipper that can produce even harmonics as well as odd harmonics in an attempt to produce the guitar sound at preamplifier power levels. The thrust of Moog is to produce harmonics when clipping. The same is true for U.S. Pat. No. 4,150,253 to Knopper. Claret, in U.S. Pat. No. 4,286,492, modifies the operating point of the amplifier to clip at lower power. Woods, in U.S. Pat. No. 3,860,876, heavily modifies the frequency response of a distorted input. Smith, in U.S. Pat. No. 4,211,893, selectively adds gain in a preamplifier stage to get distortion. Sondermeyer, in U.S. Pat. No. 4,405,832, switchable forces odd harmonic distortion and, in U.S. Pat. No. 4,439,742, creates a soft crossover distortion, also an odd harmonic phenomenon. Scholz, in U.S. Pat. No. 4,143,245, creates distortion at any sound level by operating an amplifier at maximum levels with resistive loads and driving the speaker with only a portion of the amplifier output.

In another vein, Todokoro, in U.S. Pat. No. 4,000,474, simulates a triode tube amplifier with junction field effect transistors.

The prior art is also filled with many examples of design built by many manufacturers of guitar amplifiers. Technically, the guitar amplifier is a poor example of vacuum tube amplifier design. Certainly, the guitar amplifier of today does not have the frequency response nor the clarity of the high fidelity amplifier of yesterday. However, the reason is not technical but lies in the art. The sound of inexpensive, overdriven amplifiers has become part of the art.

Thus, to simulate the vacuum tube amplifier, one must fully appreciate the nature of the components of said amplifier. One of the key components of a vacuum tube amplifier is the output transformer. The transformer passes a relatively narrow band of frequencies in the middle of the audio spectrum. The feedback in the power stage of the amplifier broadens the transformer response so that the amplifier operates effectively over a wider range of frequencies. However, when the amplifier tubes are saturated, they cannot perform the feedback function and the response narrows to the transformer response.

Of course, another key element of the vacuum tube amplifier is the tube itself. The various stages of a vacuum tube amplifier are usually coupled with capacitors that carry the signal from the output of one stage to the input of the next while blocking the constant or DC voltage of the output from the input. When the input of a stage is driven so that the grid of the vacuum tube becomes more positive than its cathode, then significant currents will flow in the grid circuit. Some of the grid current charges the coupling capacitor and thereby alters the operating point of the vacuum to amplify more asymmetrically than it usually does. When this asymmetrical waveform is amplified and clipped symmetrically by a push-pull output stage, as usually found in powerful amplifiers, it produces even as well as odd distortion harmonics. It is the even harmonics that seem to be more musical than the harsher odd harmonics.

The gain of tubes is not constant with respect to grid voltage. The gain generally increases for increasing grid voltages. The gain change produces harmonics in the output that grow rapidly with input signal increase and creates a blending into clipping distortion. This is important when analyzing class B or AB push-pull output stages.

There are digital devices currently available for producing audio effects such as chorus, flanging, reverberation, vibrato, sampling, pitch change, etc. The delay effects, such as flanging, reverberation and sampling, simply record the signal and play it back later. Pitch change records the signal and plays it back at a different rate. Harmonic analysis of these effects show that all extra frequencies that are generated are created by sampling. None of these effects intentionally introduce harmonics of the signal into the signal as in tube circuits.

Another view of these effects is that their basic intent is to recombine a signal that has been delayed and may have been attenuated with itself. Thus, the only harmonics that can be generated are due to the sampling process.

Thus, the primary object of the invention is to provide a semiconductor amplifier which simulates the distortion of a vacuum tube amplifier by introducing distortion prior to, in addition to or without clipping.

Another object of the invention is to simulate the effects of grid current flowing. This produces even harmonic distortion which is a more pleasant and musical distortion than one made of solely odd harmonics. Further, the grid current effects in a capacitively coupled circuit produces the desirable attach on a note.

A still further objection of the invention is to achieve the general improvement of guitar amplifiers of all types to provide the high power distortion effect at all power levels.

Another object of the invention is to provide an amplifier with a non-constant or variable gain stage to emulate the distortion of a Class B or AB output stage.

An even further object of the invention is to provide an amplifier with a combination bias shifter and distortion stage that operates effectively at low input levels.

An even further object of the invention is to provide analog and digital signal processors which intentionally introduces harmonics of the signal into the signal.

These and other objects of the invention are attained by a distortion synthesizer, having a first distortion circuit, a tone control circuit for altering the tonality of the first distorted signal and a second distortion circuit for introducing harmonics into said tone controlled signal. At least one of the distortion circuits introduces harmonics without clipping. The second distortion circuit also for clips the resultant signal as a function of said resultant signal. The system may be analog or a programmed digital processor. The first distortion circuit limits and introduces even harmonics, preferably predominantly second harmonics. The second distortion circuit introduces odd harmonics, preferably by predominantly third harmonics prior to clipping and can also compress the signal. The distortion circuits include a variable gain stage which increases with increased input using a plurality of switches which progressively add parallel resistors to progressively increase output current. The clipping circuit in the second distortion circuit clips as a function of amplitude, time or frequency content of the input signal. A circuit simulating transformer saturation is also provided in the second distortion circuit.

The distortion system provides a distorted signal whose harmonic content increases with increasing input signal while the gain of the fundamental decreases. The even harmonics content is initially increased with each cycle of an input signal. Also, the gain and total harmonic distortion increase for a first range of input signal amplitudes, and the gain decreases, and total harmonic distortion increases for a second range of input signal amplitude. In addition, the amplitude of the distorted signal initially decrease and subsequently increases the amplitude of the distorted signal.

Other objects, advantages and novel features of the present invention will become apparent from the following detailed description of the invention when considered in conjunction with the accompanying drawings.

DETAILED DESCRIPTION OF THE DRAWINGS

A distortion synthesizer which replicates a vacuum tube amplifier having a transformer output would include asymmetrical attenuation of inputs signal and bias point shifting to produce even harmonics for large input signals, an asymmetrical, non-constant gain to produce both even and odd harmonics for small input signals, and a clipping circuit whose clipping level is a function of the output to decompress large input signals.

Figure 1:
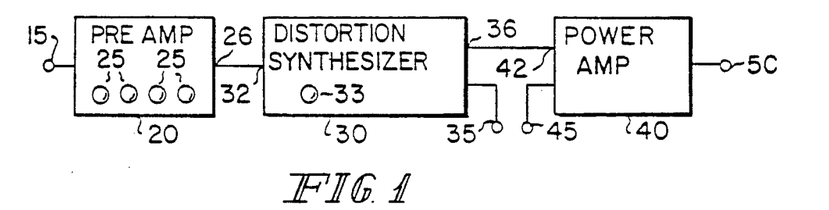
FIG. 1 is a block diagram of an audio amplifier incorporating the principles of the present invention.

An amplifier incorporating the principles of the present invention is illustrated in FIG. 1 as including an input 15 connected to a preamplification or input stage 20. A plurality of adjustments 25 are provided on the preamplifier 20. These include frequency controls, for example, bass and treble, as well as gain control. The output 26 of the preamplifier 20 is connected to the input 32 of distortion synthesizer 30 which replicates the distortion of a vacuum tube amplifier. A variable control 33 is provided to select the distortion tone or the frequency of the distortion synthesizer's filter. The first output 36 of the distortion synthesizer 30 is connected to the input 42 of the power amplifier 40. A second output 35 of the distortion synthesizer 30 available in the industry. Input 45 provides a second input to the power amplifier stage 40 from other sources other than the source 15 and more particularly the outputs of the effect devices driven by the signal from output 35. The output of the power amplifier output stage 40 is provided on terminal 50.

Figure 2:
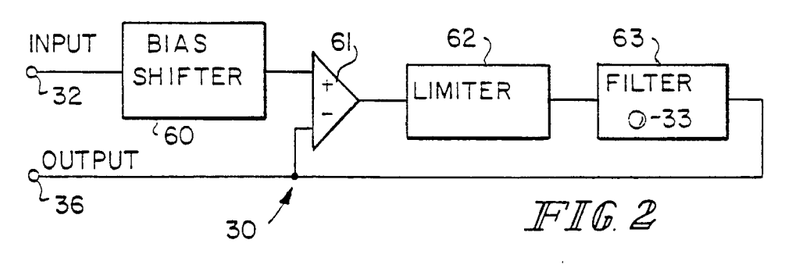
FIG. 2 is a block diagram of a distortion synthesized according to the principles of the present invention.

The block diagram of a preferred embodiment of the distortion synthesizer 30 is shown in FIG. 2. The input 32, after any required preamplification, drives the bias shifter 60 which drives the non-inverting input of amplifier 61. The output of amplifier 61 is limited by limiter 62. The limiter output is then filtered by filter 63 to produce the output 36 and feedback to the inverting input of amplifier 61. The physical realization of these functions is quite well defined by the electronics arts, for example, in a book by Tobey, Graeme, and Huelsman, "Operational Amplifiers, Design and Applications", McGraw-Hill.

The response of this embodiment when the signal is significantly limited, is that of the filter. The gain of the filter can be expressed in FORTRAN as $$F = s * h * x / [(s+w) * (s+x)]$$

where
s = the Laplace transfer operation
h = the maximum gain of the filter
w = the low frequency cutoff in radians / sec.
x = the high frequency cutoff in radians / sec.

Furthermore, let the output of the amplifier can also be expressed in FORTRAN be $$A = Vp * b - Vm * a$$

where
Vp = the non-inverting input voltage
b = the non-inverting gain
Vm = the inverting input voltage
a = the inverting output gain Then the response for the above system, when there is no limiting, is $$R = s * b * h * x / ((s+w) * (s+x) + s * a * h * x)$$

which has the following approximate characteristics:
center frequency gain = b * h / (1 + a * h)
low frequency cutoff = w / (1 + a * h)
high frequency cutoff = x * (1 + a * h)

This amplifying system then produces a larger bandwidth with lower low frequency cutoff and higher high frequency cutoff than the filter 63 when a * h is larger than zero and preferably three or larger.

Notice that this block diagram consists of functions that are each well known in the electronics arts that may be implemented with a variety of technologies, vacuum tubes, semiconductors, linear integrated circuits, and digital signal processors.

Figure 3:
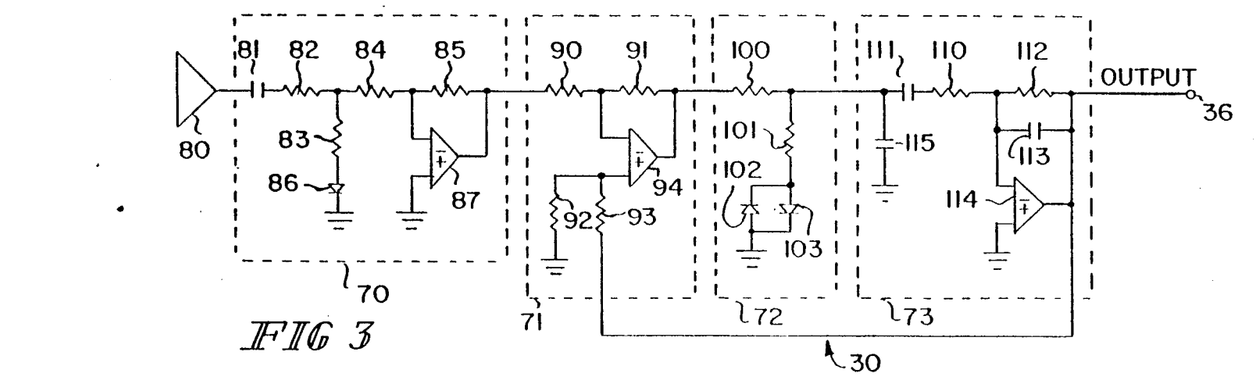
FIG. 3 is a schematic of a distortion synthesized low power level operation according to the principles of the present invention.

An embodiment for the block diagram of FIG. 2 is shown in FIG. 3. The bias shifter 70 is similar to bias shifter 60. The amplifier 71 is similar to amplifier 61 except that actual amplifiers exhibit limiting as their output voltages approach their power supply voltages. The limiter 72 is similar to limiter 62 except that it depends upon the limiting nature of the amplifier 71 and that it provides a reasonably large output impedance for the filtering circuit 73. Again, the filter 73 is similar to filter 63.

The input signal on input 32 is from a preamplifier 80 which is configured as required. The bias shifter 70 is capacitively coupled by capacitor 81. Resistors 82, 84 and 85 form a standard inverting amplifier with operational amplifier 87 until the signal becomes greater than the conduction voltage of diode 86. Then the signal faces the same alterations as the signal through a tube that has grid current, namely, the signal is asymmetrically attenuated and the signal is offset by the charge on capacitor 81. Resistor 83 limits the charging rate of the capacitor 81 and thereby prolongs the bias shifting process gradually on a plurality of cycles. Limiting the charging rate is important because the attack of a note is then not offset while later portions of the note are offset. The limiter 72 can thus create waveforms with more power for the attack on the beginning than for the later portions of the note which is highly distorted. This additional power is needed to achieve the desired musical effects.

The amplifier 71 includes resistors 90 through 93 and an operational amplifier 94. Appropriate choices in resistor values can create the required gains a and b above. The operational amplifier 94 also helps the limiting function 62 by limiting its own output to be between the power supply voltages.

The function of limiter 62 is completed by limiter 72 which uses two resistors 100, 101 and two diodes 102, 103. This specific construction of resistors and diodes not only limits or clips the signal, but also produced harmonics with smaller amplitudes than clippers without resistor 101. The resistor 100 is similar to the unsaturated plate resistance of the output tube, while resistor 101 is similar to the saturated plate resistance. The diodes have a voltage drop similar to the maximum voltage excursion of the plate voltage. These diodes are preferably light emitting diodes chosen for their voltage versus current characteristics. Of course, these similarities are in a proportional sense because inexpensive operational amplifiers have smaller voltages and currents than amplifier output tubes.

The filter 73 is realized with high-pass components 110 and 111, and low-pass components 112 and 113 connected to operational amplifier 114. Capacitor 115 loads the limiter to produce another rolloff in the filter response. This additional reactive component and its consequential additional rolloff produces a twelve decibel per octave rolloff in the audio range for a sweeter distortion toneality.

This filter 73 is a generic representation of a generalized filter. In practice it is desirable to make the frequency cutoffs variable. This provides the musician or listener distortion tone controls to control the tone of the distortion. Since the feed-back extends the frequency response, the distortion tone controls have little effect on the unsaturated operation.

At low input signal levels, the diodes 86, 102 and 103 do not conduct and therefore do not produce any level shifting or limiting. The transfer characteristics of the distortion synthesizer 30 is clear, broad and undistorted. At high input signal levels, the diodes do conduct to produce a narrower band of signals with both even and odd harmonics. The actual values of the above components are chosen quite subjectively. The ultimate design must suit the ear of the musician.

It should be now clear that one of the objectives of this invention has been met in that the frequency response is varied as a function of input signal levels. A guitar amplifier can be synthesized at low power levels by providing the distortion synthesizer 30 of FIGS. 2 and 3 between premaplifier stage 20 and an output power amplifier stage 40. This results from the use of diodes to determine the signal level at which distortion takes place. Furthermore, it can be executed reliably using inexpensive components.

Figure 4:
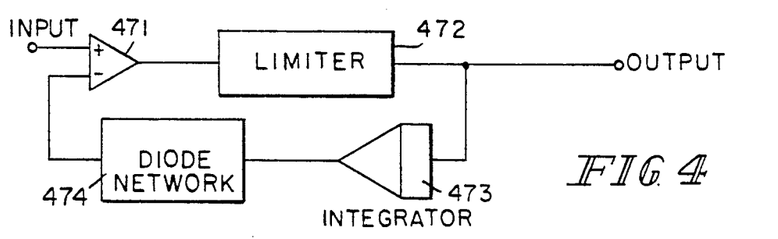
FIG. 4 is a schematic of another distortion synthesizer of transformer saturation according to the principles of the present invention.

Saturation of the transformer is simulated in FIG. 3 by the loop including amplifier 71, limiter 72, filter 13 and feed-back means 30. A second embodiment of this loop is shown in FIG. 4. An input is provided to operational amplifier 471. This output is connected to the output terminal through limiter 472. The output of limiter 472 it is provided through an integrating filter 473 to a resistor diode network 474 who's output is connected and completes feed-back loop to the input of the operational amplifier 471.

The output of limiter 472 represents the voltage from a transformer and is converted by the integrating filter 473 to a signal proportional to the transformer flux. The resister-diode feed-back network converts the signal from the integrater 473 to a signal proportional to the transformer magnetizing current which reduces the effect of the input in amplifier 471. The resistor-diode network 474 approximates the flux to current function which is approximately the tanqent function. Any of the odd harmonic generating resistor-diode networks to be described can be used to generate the tangent function by selection of appropriate resistor valves.

The circuit of FIG. 4 is an accurate simulation of the transformer in response to low frequency signals and signals which have a DC component created by clipping asymmetrical wave form which is common to guitars. Either of these signals force a large signal from integrating filter 473. The output of the integrator 473 produces a low frequency in the latter portion of these half cycles and reduces the DC component of the asymmetrically clipped signals.

The operation of a distortion synthesizer that simulates the input to output characteristics of a tube amplifier has been described. This circuit may be implemented in a variety of ways, with semiconductors or tubes, with transformers or filters, just not tubes and transformers since that is the art being synthesized.

VARIABLE GAIN

The output stage of a tube amplifier typically consists of a phase splitter and a pair of output pentode tubes operating in class B or AB. The transconductance of the pentodes increases with increasing grid voltage. Assuming that the pentodes have the same characteristics, the changing gain produces odd harmonic distortion. However, the pentodes are generally not matched or not matched perfectly and, consequently, even harmonics are produced as well.

Figure 5:
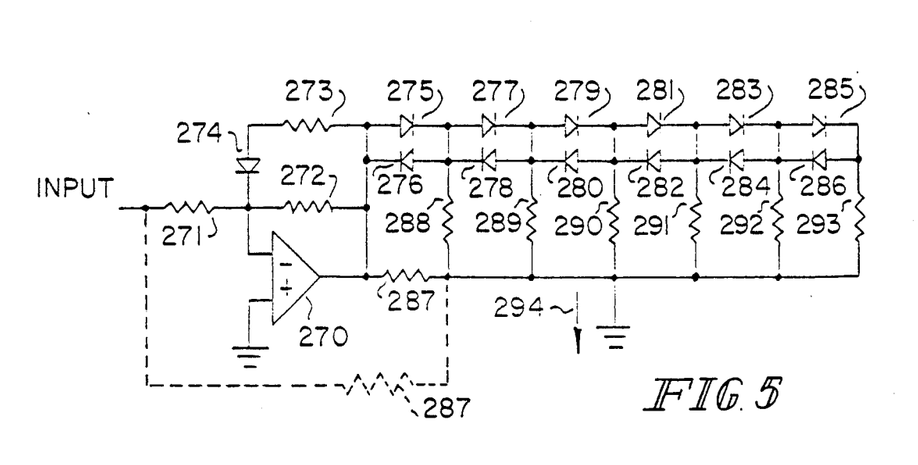
FIG. 5 is a schematic of the variable gain stage according to the principles of the present invention.

FIG. 5 shows a variable gain amplifier which produces a current from an input signal which has both even and odd harmonics of the signal. The circuit has an operational amplifier 270 with its non-inverting input grounded. The input signal current passes through resistor 271. This current is matched by the feedback currents in resistors 272, 273. The diode 274 limits the current flow in resistor 273 to essentially one direction. The gain of this stage is then proportional to resistor 272 for one polarity input and, neglecting the diode forward voltage, proportional to parallel value of resistors 272 and 273 for the other polarity input. This portion of the circuit generates the even harmonics corresponding to the tube mismatch.

The circuit of FIG. 5 continues with diodes 275 through 286 operating as switches and resistors 287 through 293 that convert the output of operational amplifier 270 into current 294 (which is shown going to ground because the input to the following stage is approximately ground). For output voltage magnitudes less than one diode drop, this current is proportional to the conductance of resistor 287. For output voltage magnitudes between one and two diode drops, the current change is proportional to the sum of the conductances of resistors 287 and 288. Similarly, for magnitudes between two and three; the current change is proportional to the sum of the conductances of resistors 287 through 289. The operation of the diodes simply brings more and more resistors in parallel until, for output voltage magnitudes greater than six diode drops, the change in current 294 is proportional to the sum of the conductances of resistors 287 through 293. This relationship of voltages and currents generates odd harmonics.

The even harmonic amplitudes may be controlled by the relative values of resistors 272 and 273. Large values for resistor 273 produce even harmonics with smaller amplitudes than smaller resistor values. Similarly, large values for resistors 288 through 293 produce odd harmonics with smaller amplitudes than smaller resistor values. The individual amplitudes of the odd harmonics can be changed by changing the values of resistors 288 through 293. If these resistors are equal, then the circuit approximates the square law transfer characteristic often applied to vacuum tubes.

The number of diodes and resistors ma be increased to handle larger voltages at the output of amplifier 270. This example works with signals up to about 4 volts peak when the diode forward drop is about 0.6 volts. The number of sections of a pair of diodes and a resistor, as well as the resistor values, determines the smoothness of the gain variation.

A mathematical view of the variable gain circuit is that the diodes and resistors form a piecewise linear approximation to the variable gain. Another view of the variable gain circuit is that the ratio of the output signal to the input signal increases with an increasing input signal.

The resistor-diode network of FIG. 5 without diode 274 and resistors 273 and proper selection of the resistor valves of 288 through 293 will produce a current 294 proportional to the input cube. The register would be proportion by 1, 0.5, 0.333, 0.25, 0.2, 0.166, . . . etc. The resistor 287 supplies the fundamental frequency with the odd harmonics added in-phase in FIG. 5. To achieve the desired compression, the resistor 287 could be connected between the input and output of the amplifier 270 as shown in phantom in FIG. 5. This places the harmonics out of phase with the fundamental. Thus, as the gain of the harmonics increase with increased input signal, while the gain or content of the fundamental decreases.

Figure 6:
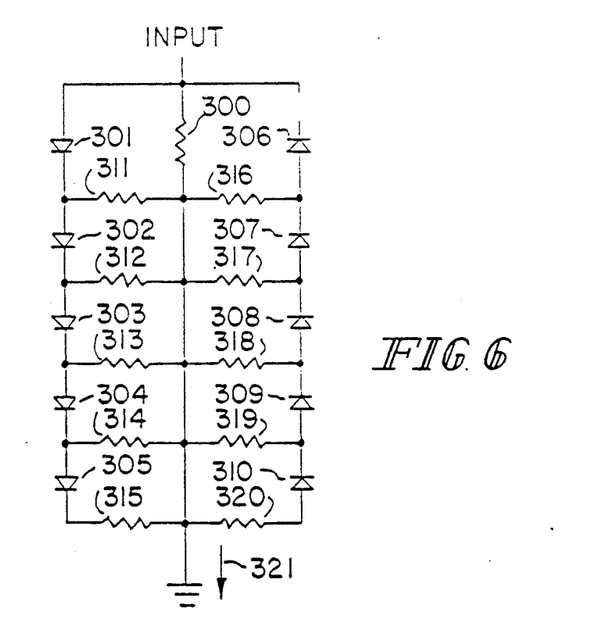
FIG. 6 is a schematic of the variable attention stage according to the principles of the present invention.

FIG. 6 shows a non-constant attenuator similar to a portion of FIG. 5. Here diodes 301 through 305 and resistors 311 through 315 handle positive currents while diodes 306 through 310 and resistors 316 through 320 handle negative currents. The current 321 for input voltage magnitudes less than one diode drop is proportional to the conductance of resistor 300. The current change for positive voltages between one and two diode drops is determined by resistors 300 and 311. For inputs between two and three drops, the current change is determined by resistors 300, 311 and 312. Greater voltages involve more resistors. The current changes for negative voltages are determined similarly. FIG. 6 is more flexible than FIG. 5, but may be more expensive.

The operational amplifier art is repleat with non-linear amplifying circuits, some may be found in the aforementioned text "Operational Amplifiers, Design and Applications", Tobey et al., McGraw-Hill.

As compared to semiconductor amplifiers, tubes have full, rich tone qualities. It has been found that the fullness and richness are created by low order harmonics, created by the non-linear characteristics of the two, particularly the triode. Although, any non-linear transfer function will produce harmonics, non-linear transfer functions must be designed so as to produce low order harmonics without producing significant higher order harmonics. Trigonomically, the second and third harmonics are produced by second order and third order terms in a Taylor series expansion of the transfer function. The higher order terms of the Taylor series also produce undesirable higher order harmonics. The third order term also produces fundamental and well as a third harmonics. The phase of the third order term will either enhance or diminish the input signal. By diminishing the input signal, one provides the desired compression also found in tube amplifiers.

Figure 7:
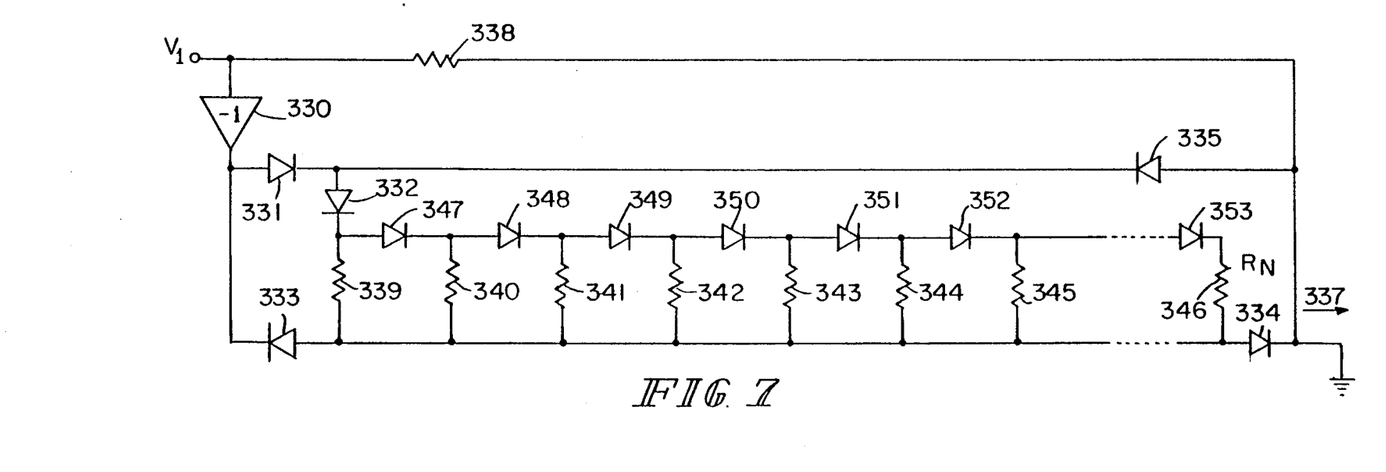
FIG. 7 is a modification of FIG. 5 for odd harmonics.

A modification of FIG. 5 to produce the third order harmonics without any significant higher order odd harmonics is illustrated in FIG. 7. A bridge formed by diodes 331, 333, 334 and 335 includes a resistor-diode network connected between a pair of opposed terminals through diode 332 and a resistor 338 connected between the other pair of opposed terminals through inverting buffer 330. The input $V_1$ is applied to the inverting buffer 330 and the output current 337 is to be connected to the virtual ground of an output amplifier.

The ladder includes resistors 339 through 346 and inter-connected by diodes 347 through 353. By proper sizing of the resistors 339 through 346, the current 337 is made proportional to the cube of the input. Sizing of the resistors 339 through 346 are proportioned by 1, 0.5, 0.333, 0.25, 0.2, 0.166 etc. If other or different harmonics are desired, the resistors are then selected. The use of the bridge of diodes 331, 333, 334 and 335 reduce the number of diodes in the resistor-diode network needed in half compared to the network of FIG. 5.

The resistor diode network is a approximation. The quality of this approximation is dependant upon the number of sections in the network. The quality of the mathematical approximation is dependent upon the number of terms, or as a sampling system, are dependent upon the frequency of samples. This approximation is not perfect and does produce some higher order harmonics, but not a significant amount. It should also be noted that triodes also produce small amounts of higher order harmonics. The number of sections must then be significant to reduce the high order harmonics to a reasonable level. Any unwanted harmonics produced should be at least 20 db below the level of the desired harmonics. Furthermore, the number of sections must be sufficient to cover the expected signal range, otherwise the network will rapidly become linear as all the diodes turn-on.

Whereas the resistor 287, in FIG. 5, supplies the fundamental frequency in phase with the resistor diode network, resistor 338 is in phase with the fundamental frequency and out of phase with the resistor diode network and therefore produces the desired compression. This compression produces a drop in the gain of the fundamental with increasing input.

Figure 8:
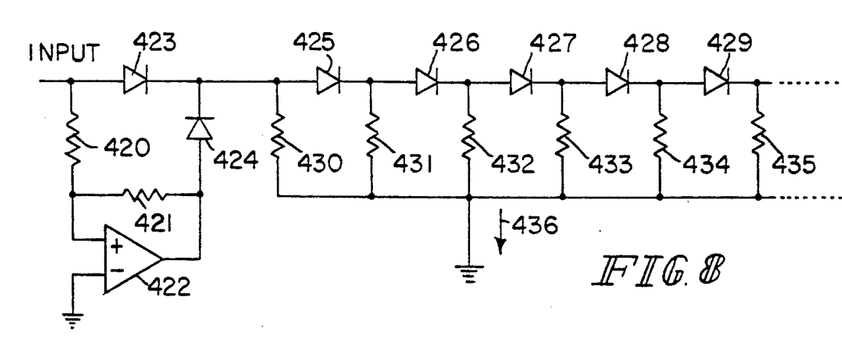
FIG. 8 is a modification of FIG. 5 for even harmonics.

The production of a pure or nearly pure second harmonics may be achieved using the circuit of FIG. 8. FIG. 8 is a full wave version of the resistor diode network of FIG. 6. The input is provided through resistor 420 to the amplifier 422 which includes feed-back resistor 421 and diode network 423 and 424. The resistive diodes network includes resistors 430 through 435 and diodes 425 through 429. The resistors 420 and 421, amplifier 422, and diodes 423 and 424 produce approximately the absolute value of the input. The diode resistive bridge shapes the resulting current 436 to be proportion to the square of the input. With proper sizing of the resistors 433, 435 will produce this proportionality. The appropriate sizing is 430 equal to 2 and the remaining resistors equal to 1. Other proportions of the resistors values will produce other harmonics singularly or in combination with other harmonics. As with FIG. 7, FIG. 8 produces significant second order even harmonics with no significant higher order even harmonics. Higher order harmonics that may be generated are greater than 20 db below the desired harmonics.

The introduction of even or odd harmonics using FIGS. 5 through 8 may be in any of the distortion stages to produce harmonics without clipping.

ANOTHER ANALOG AMPLIFIER STRUCTURE

Figure 9:
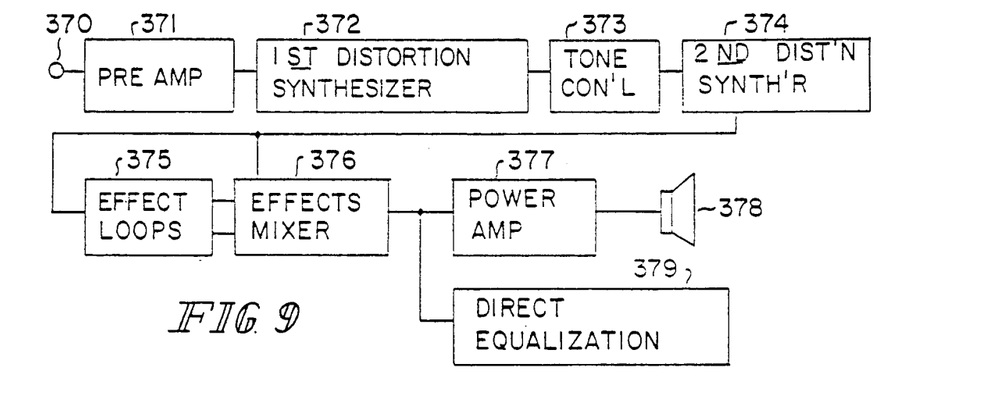
FIG. 9 is a block diagram of the overall structure of the amplifier according to the principles of the present invention.

FIG. 9 is a block diagram of a second embodiment of a semiconductor amplifier with tube amplifier characteristics. The amplifier has an input 370 which is the input to the preamplifier. The preamplifier 371 includes the capacitive input loading as to present the proper input impedance and includes filtering which establishes the basic tonal characteristic of the amplifier. The preamplifier 371 drives the first distortion circuit 372 which is preferably a combination bias shifter and distortion stage. The resulting signal is tonally modified by tone controls 373 before being distorted again by the second distortion synthesizer 374 which is the harmonic generator of FIG. 5. The output of the second distortion synthesizer 374 drives the effects loops 375. Both the second distortion synthesizer and effect loops 375 drive the effects mixer 376 which in turn drives the power amplifier 377 and speaker 378 and a direct equalization circuit 379. The direct equalization circuit 379 provides an output 380 representative of the signal produced by the speaker 378 and a microphone located very near the speaker.

DIGITAL EMBODIMENT

FIGS. 2-9 show circuits whose intent is to introduce harmonics of the input signal into the output circuit. The operational characteristics of some of these figures are translated into computer operations to also produce a digital system for purposely introducing harmonics of an input signal into the signal during the signal processing. Virtually all amplifiers and signal processors introduce harmonics of a signal into the signal. However, this is generally not intentional and is usually considered a fault of the amplifier or signal processor. However, this is not the case with the present invention which intentionally introduces harmonics of a signal into the signal.

A measure of the intent to introduce harmonics of a signal into the signal for a system is to analyze the system assuming perfect components. The harmonics generation of a system that does not intend to introduce harmonics will then be at the limits of the mathematic processes, while one which intends to introduce harmonics will still have significant harmonics. Perfect characteristics for digital system include infinite sampling rates, computation rates, memory and precision.

Figure 10:
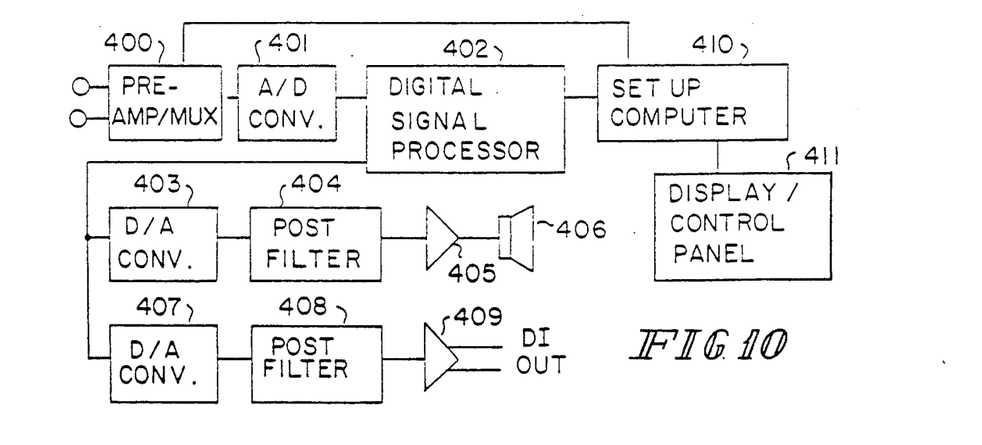
FIG. 10 is a block diagram of a computer system for emulating a guitar amplifier according to the principles of the present invention.

FIG. 10 is a block diagram of a digital computer system for emulating a guitar amplifier. The input of the amplifier is received by the preamplifier 400 which provides the proper loading to the guitar(s) or input source(s) and provides any filtering that is common to all desired tonal characteristics as well as providing anti-aliasing filtering required by the analog to digital converter 401. The digital signal processor 402 receives and processes the sampled signal. The processing provides the tonal characteristics of preamplifier 371 which may include resonances, the distortion and bias shifting of the first distortion synthesizer 372, the tone control of 373, the harmonic generation and power supply emulation of the second distortion synthesizer 374, the effects that may be connected to effects loop 375, the effects mixing of effects mixer 376, and the filtering and time delaying of the direct equalization 379. The digital signal processor 402 drives the digital to analog converter 403, post conversion filter 404, power amplifier 405 and speaker 406. Alternatively, the digital signal processor 402 drives the digital to analog converter 407, post conversion filter 408 and balanced output amplifier 409.

A setup computer 410 controls the digital signal processor 402 with filter type selections, filter parameters, gain values, and effects parameters from inputs from an electrical interface such as Musical Instrument Digital Interface, a footswitch, and panel controls 411. The setup computer also displays via 411 its operation mode and provides a user friendly interface for setup command editing.

Although the present invention has been described and illustrated in detail, it is to be clearly understood that the same is by way of illustration and example only, and is not to be taken by way of limitation. The spirit and scope of the present invention are to be limited only by the terms of the appended claims.

What is claimed:

1. A semiconductor distortion system comprising;
input means for receiving an input signal;
first distortion means for introducing harmonics into said input signal to produce a first distorted signal;
tone control means for altering the tonality of said first distorted signal and producing a tone controlled signal;
second distortion means for introducing harmonics into said tone controlled signal to produce a second distorted signal;
output means for providing said second distorted signal as an output signal; and
at least one of said distortion means introduces harmonics without clipping.

2. A system according to claim 1 wherein said first distortion means introduces second harmonics.

3. A system according to claim 2 wherein said second distortion means introduces third harmonics.

4. A system according to claim 1 wherein said first and second distortion means include gain means for changing the gain of said distortion means as a function of said input signal.

5. A system according to claim 4 wherein said gain means includes a ladder of switches and resistors for progressively adding parallel resistors as a function of said input signal.

6. A system according to claim 1 wherein said second distortion means introduces third harmonics.

7. A system according to claim 1 wherein at least one of said distortion means includes clipping means for introducing harmonics.

8. A distortion circuit comprising:
a bias shifter; and
distortion stage including harmonic means for introducing harmonics at the output of said distortion means without clipping.

9. The circuit of claim 8 wherein said harmonic means includes gain means for changing the gain of said harmonic means as a function of the input to said harmonic means.

10. The circuit of claim 8 wherein said harmonic means includes a ladder of switches and resistors for progressively adding resistors in parallel as a function of the input to said harmonic means.

11. The circuit of claim 8 wherein said harmonic means introduces second harmonics.

12. The circuit of claim 8 wherein said harmonic means introduces third harmonics.

13. An odd harmonic audio generator comprising:
a bridge having four bridge switches, an input terminal an output terminal and a pair of ladder terminals and;
a ladder of switches and resistors connected across said ladder terminals for progressively adding parallel resistors as a function of a signal between said ladder terminals to provide an output current proportional to an odd power of said signal between said input and output terminals.

14. A generator according to claim 13 wherein said ladder is a $\pi$ ladder with parallel resistors connected by ladder switches.

15. A generator according to claim 13 wherein said resistors are proportioned in a series 1, 0.5, 0.33, 0.25, . . . etc. for producing third power.

16. A semiconductor audio system comprising:
input means for receiving an input signal;
harmonic means for introducing harmonics into said input signal without clipping to produce a modified signal;
clipping means for introducing harmonics into said input signal to produce a modified signal; and
output means for providing said modified signals as an output signal.

17. A semiconductor distortion system comprising:
input means for receiving an input signal;
distortion means for introducing harmonics into said input signal;
saturation means for introducing saturated transformer simulated signals into said input signal; and
output for providing said input signal with said harmonics and saturated transformer simulated signals as an output signal.

18. A system according to claim 17 wherein said distortion means introduces third harmonics.

19. A system according to claim 17 wherein said distortion means includes gain means for changing the gain of said distortion means as a function of said input signal.

20. A system according to claim 19 wherein said gain means includes a ladder of switches and resistors for progressively adding parallel resistors as a function of said input signal.

21. A system according to claim 19 wherein said gain means introduces said harmonic in-phase with the fundamental.

22. A system according to claim 19 wherein said gain means introduces said harmonic out-of-phase with the fundamental.

23. A system according to claim 17 wherein said saturation means includes
first means for converting said input signal to a flux signal proportional to a transformer's flux; and
second means for converting said flux signal to a magnetizing signal proportional to a transformer's magnetizing current.

24. A system according to claim 23 wherein said first and second means are in a loop with a limiter, said input means, and said output means.

25. A system according to claim 23 wherein said first means includes an integrator filter and said second means includes a tangent transfer function generator.

26. A system according to claim 17 wherein said distortion means and said saturation means each include a ladder of switches and resistors for progressively adding parallel resistors as a function of said input signal.

27. A semiconductor distortion system comprising:
input means for receiving an input signal;
first distortion means for introducing harmonics into said input signal to produce a first distorted signal;
tone control means for altering the tonality of said first distorted signal and producing a tone controlled signal;
second distortion means for introducing harmonics into said tone controlled signal to produce a second distorted signal;
output means for providing said second distorted signal as an output signal; and
at least one of said distortion means includes a bias shifter.

28. The semiconductor system of claim 27 wherein at least one of said distortion means introduces harmonics without clipping.

29. An even harmonic audio generator comprising:

input means for providing an absolute value of an input signal; and a ladder of switches and resistors for progressively adding parallel resistors as a function of said absolute value to provide an output current proportional to an even power of said absolute value.

30. A generator according to claim 29 wherein said ladder is a $\pi$ ladder with parallel resistors connected by ladder switches.

31. A generator according to claim 29 wherein the number of ladder switches and resistors are sufficiently large to minimize introduction of other harmonics.

32. A generator according to claim 29 wherein said resistors are proportional in a series of 2, 1, 1, 1, ... etc. for producing second power.

33. A semiconductor audio system comprising:

input means for receiving an audio input signal;

harmonic means for introducing harmonics into said input signal to produce a modified signal including a ladder of series connected switches connected with a network of resistors for progressively adding resistors as a function of said input signal; and output means for providing said modified signal as an audio output signal.

34. The system of claim 33 wherein said ladder is a $\pi$ ladder with parallel resistor legs connected by series connected diodes.

35. The system of claim 33 including clipping means for introducing harmonics into said signal.

36. The system of claim 33 including bias shifting means.

37. The system of claim 33 wherein said resistors are proportional in a series of 1, 0.5, 0.33, 0.25, 0.2, ... etc. for producing predominantly third harmonics.

* * * * *

UNITED STATES PATENT AND TRADEMARK OFFICE
CERTIFICATE OF CORRECTION

PATENT NO.   :   5,133,014
DATED        :   July 21, 1992
INVENTOR(S)  :   Eric K. Pritchard It is certified that error appears in the above-indentified patent and that said Letters Patent is hereby corrected as shown below:

Column 1, line 1
insert --The present application is a continuation-in-part of U.S. Serial No. 280,213 filed November 1, 1988, which is now U.S. Patent No. 4,995,084 issued February 19, 1991, which is a national phase of PCT/US88/01025 filed March 23, 1988, which is a continuation-in-part of U.S. Serial No. 29,144 filed March 23, 1987, which is now U.S. Patent No. 4,809,336 issued February 28, 1989.--

Signed and Sealed this

Twenty-first Day of February, 1995

Attest:

BRUCE LEHMAN

*Attesting Officer*    *Commissioner of Patents and Trademarks*